(12) United States Patent
Liu et al.

(10) Patent No.: US 11,500,433 B2
(45) Date of Patent: Nov. 15, 2022

(54) FLEXIBLE ELECTRONIC DEVICE

(71) Applicant: Au Optronics Corporation, Hsinchu (TW)

(72) Inventors: Chan-Jui Liu, Hsinchu (TW); Chun-Cheng Cheng, Hsinchu (TW); Pin-Miao Liu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 217 days.

(21) Appl. No.: 17/111,482

(22) Filed: Dec. 3, 2020

(65) Prior Publication Data

US 2021/0216116 A1 Jul. 15, 2021

Related U.S. Application Data

(60) Provisional application No. 62/960,846, filed on Jan. 14, 2020.

(30) Foreign Application Priority Data

Jun. 17, 2020 (TW) ................................. 109120379

(51) Int. Cl.
  *G06F 1/18* (2006.01)
  *G09F 9/30* (2006.01)
  *H01L 27/32* (2006.01)
  *H01L 27/15* (2006.01)

(52) U.S. Cl.
  CPC .............. *G06F 1/189* (2013.01); *G09F 9/301* (2013.01); *H01L 27/15* (2013.01); *H01L 27/32* (2013.01)

(58) Field of Classification Search
None
See application file for complete search history.

(56) References Cited

U.S. PATENT DOCUMENTS

| 5,978,231 A | 11/1999 | Tohya et al. |
| 6,845,016 B2* | 1/2005 | Matsueda ........... H01L 27/3279 361/795 |
| 7,317,199 B2* | 1/2008 | Inoguchi ................. H01L 24/97 250/214 R |

(Continued)

FOREIGN PATENT DOCUMENTS

| CN | 1083684 | 4/2002 |
| CN | 101389182 | 3/2009 |

(Continued)

*Primary Examiner* — Vinh T Lam
(74) *Attorney, Agent, or Firm* — JCIPRNET

(57) ABSTRACT

A flexible electronic device including a flexible substrate, a plurality of first signal lines, a plurality of first transmission lines, a plurality of first through holes, and a plurality of first conductive structures is provided. The flexible substrate has a first surface and a second surface opposite to the first surface. The first signal lines are located on the first surface and have a first extending direction. The first transmission lines are located on the second surface and have a second extending direction. A first included angle is provided between the first extending direction and the second extending direction. An angle of the first included angle is between 10° and 80°. The first through holes penetrate through the flexible substrate. The first conductive structures are located in the first through holes and are electrically connected to the first signal lines and the first transmission lines.

16 Claims, 8 Drawing Sheets

(56) References Cited

U.S. PATENT DOCUMENTS

| | | | |
|---|---|---|---|
| 9,089,050 B2 | 7/2015 | Kajiya | |
| 9,406,723 B2* | 8/2016 | Lee | G09G 3/3233 |
| 9,773,853 B2* | 9/2017 | Tao | H01L 51/5253 |
| 9,941,334 B2* | 4/2018 | Hsu | G09G 5/02 |
| 10,091,876 B2* | 10/2018 | Kim | H05K 1/111 |
| 10,224,380 B2* | 3/2019 | Hsu | G09G 3/3233 |
| 10,236,329 B2* | 3/2019 | Chen | H01L 51/52 |
| 10,636,846 B2* | 4/2020 | Park | H01L 27/3276 |
| 10,672,800 B2* | 6/2020 | Lee | G02F 1/133345 |
| 10,674,605 B2* | 6/2020 | Kim | H01L 21/00 |
| 10,692,942 B2* | 6/2020 | Kim | H01L 51/525 |
| 10,818,735 B2* | 10/2020 | Li | H01L 51/0097 |
| 10,867,971 B2* | 12/2020 | Liu | H01L 33/62 |
| 10,892,313 B2* | 1/2021 | Kim | H01L 27/3248 |
| 10,910,316 B2* | 2/2021 | Wu | H01L 25/13 |
| 10,937,722 B1* | 3/2021 | Lin | H01L 23/49838 |
| 10,950,175 B1* | 3/2021 | Yang | H01L 33/50 |
| 10,957,745 B2* | 3/2021 | Hong | G06F 3/0448 |
| 10,991,861 B2* | 4/2021 | Bergmann | H01L 33/44 |
| 11,031,446 B2* | 6/2021 | Jo | H01L 27/1218 |
| 11,087,661 B2* | 8/2021 | Huang | G09F 9/301 |
| 11,249,232 B2* | 2/2022 | Lin | G02F 1/133528 |
| 2009/0071702 A1* | 3/2009 | Lin | H05K 1/025 174/261 |
| 2013/0092421 A1 | 4/2013 | Kajiya | |
| 2018/0197924 A1* | 7/2018 | Tada | G06F 3/0446 |
| 2020/0043384 A1* | 2/2020 | Li | G06F 3/041 |
| 2020/0058710 A1 | 2/2020 | Li | |
| 2020/0212125 A1* | 7/2020 | Liu | H01L 27/3216 |
| 2020/0233469 A1* | 7/2020 | Won | H05K 7/2039 |
| 2020/0373333 A1* | 11/2020 | Liang | H01L 27/124 |
| 2022/0077427 A1* | 3/2022 | Lee | H01L 51/5253 |

FOREIGN PATENT DOCUMENTS

| | | | | |
|---|---|---|---|---|
| CN | 109003960 | | 12/2018 | |
| CN | 109062442 | | 12/2018 | |
| CN | 109166906 A | * | 1/2019 | H01L 27/3211 |
| CN | 109755412 | | 5/2019 | |
| JP | 2019204502 A | * | 11/2019 | G02F 1/13338 |
| TW | 201220975 | | 5/2012 | |

* cited by examiner

FLEXIBLE ELECTRONIC DEVICE

CROSS-REFERENCE TO RELATED APPLICATION

This application claims the priority benefits of U.S. provisional application Ser. No. 62/960,846, filed on Jan. 14, 2020 and Taiwan application serial no. 109120379, filed on Jun. 17, 2020. The entirety of each of the above-mentioned patent applications is hereby incorporated by reference herein and made a part of this specification.

BACKGROUND

Technical Field

The disclosure relates to an electronic device, and in particular, to a flexible electronic device.

Description of Related Art

Generally, in the fabrication process of a flexible electronic device, a flexible substrate is temporarily adhered to a rigid carrier. Heating, depositing, etching, and other subsequent element fabrication processes are then performed on the flexible substrate located on the rigid carrier. Next, the flexible substrate with the elements is removed from the rigid carrier. Nevertheless, stresses on two opposite sides of the flexible substrate in the flexible electronic device are not matched as affected by the structures of the elements. Accordingly, when the flexible substrate with the elements is removed from the rigid carrier, the flexible substrate may be easily curled and deformed.

SUMMARY

The disclosure provides a flexible electronic device which may not be easily curled and deformed when not being applied by an external force.

The disclosure provides a flexible electronic device including a flexible substrate, a plurality of first signal lines, a plurality of first transmission lines, a plurality of first through holes, and a plurality of first conductive structures. The flexible substrate has a first surface and a second surface opposite to the first surface. The first signal lines are located on the first surface of the flexible substrate. The first signal lines have a first extending direction. The first transmission lines are located on the second surface of the flexible substrate. The first transmission lines have a second extending direction. A first included angle is provided between the first extending direction and the second extending direction, and an angle of the first included angle is between 10° and 80°. The first through holes penetrate through the flexible substrate. The first conductive structures are located in the first through holes, and the first conductive structures are electrically connected to the first signal lines and the first transmission lines.

To sum up, in the flexible electronic device, the first transmission lines are located on the second surface, and the first included angle of 10° to 80° is provided between the first extending direction of the first signal lines and the second extending direction of the first transmission lines. In this way, the flexible electronic device may not be easily curled and deformed when not being applied by an external force.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
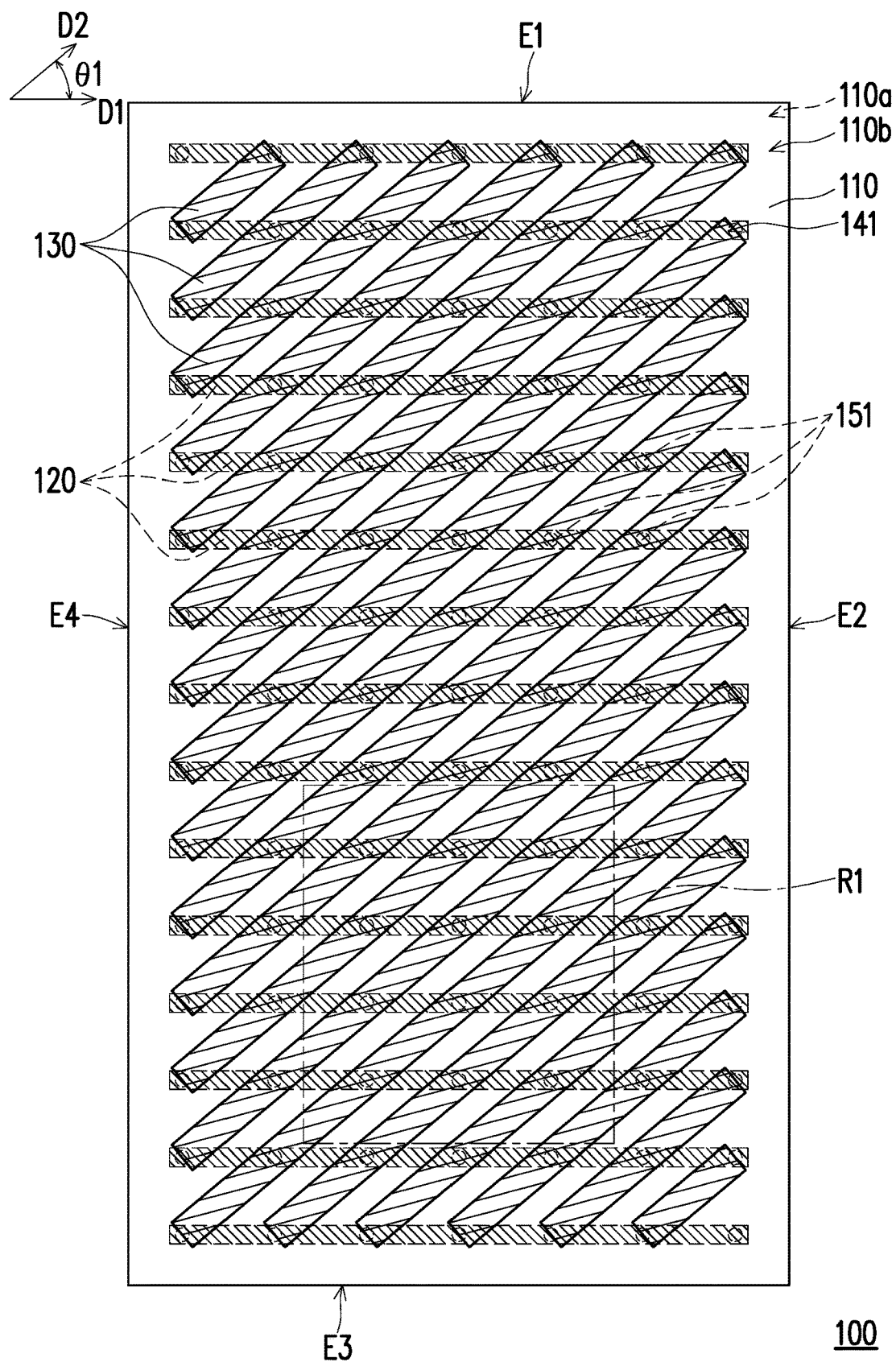
FIG. 1A is a bottom schematic view of a flexible electronic device according to a first embodiment of the disclosure.

To make the aforementioned more comprehensible, several embodiments accompanied with drawings are described in detail as follows. As known to a person of ordinary skill in the art, the described embodiments may be modified in various different ways without departing from the spirit or scope of the disclosure.

In the accompanying drawings, thicknesses or sizes of elements and the like are exaggerated for clarity. Throughout the specification, the same reference numerals in the accompanying drawings denote the same elements. It should be understood that when an element such as a layer, film, region, or substrate is referred to as being "on another element", "connected to another element", or "overlaps with another element", it can be directly on, connected to, or overlaps with the another element, or intervening elements may also be present. In contrast, when an element is referred to as being "directly on" or "directly connected to" another element, there are no intervening elements present. As used herein, the term "connected" may refer to physically connected and/or electrically connected.

It should be understood that, although the terms "first", "second", "third", etc., may be used herein to describe various elements, components, regions, layers and/or portions, these elements, components, regions, layers, and/or portions should not be limited by these terms. These terms are used to distinguish one element, component, region, layer, or portion from another element, component, region, layer, or portion. Therefore, the "first element", "component", "region", "layer", or "portion" discussed below may be referred to as the second element, component, region, layer, or portion without departing from the teachings of the specification.

The terminology used herein is for the purpose of describing particular embodiments only and is not intended to be limiting. As used herein, unless clearly indicated otherwise, the singular forms of "a", "one", and "the" in the content are intended to include plural forms, including "at least one", and "or" represents "and/or". The term "and/or" used herein includes any or a combination of one or more of the associated listed items. It will be further understood that the terms "comprises", "comprising", "includes", and/or "including" when used in the specification specify the presence of stated features, regions, integers, steps, operations, elements, and/or components, but do not preclude the presence or addition of one or more other features, regions, integers, steps, operations, elements, components, and/or groups thereof.

Moreover, relative terms such as "below" or "bottom" and "above" or "top" may serve to describe the relation between one component and another component in the text according to the illustration of the drawings. It should also be understood that the relative terms are intended to include different orientations of a device in addition to the orientation shown in the drawings. For example, if a device in the drawings is flipped, a component described as being disposed "below" other components shall be re-orientated to be "above" other components. Thus, the exemplary term "below" may cover the orientations of "below" and "above", depending on a specific orientation of the drawings. Similarly, if a device in a figure is flipped over, the element originally described to be located "below" or "underneath" other elements is oriented to be located "on" the other elements. Therefore, the illustrative term "under" or "below" may include orientations of "above" and "under".

The term "basically" as used in the specification is inclusive of the stated value and means within an acceptable range of deviation for the particular value as determined by persons of ordinary skill in the art, considering the measurement in question and the error associated with measurement of the particular quantity (i.e., the limitations of the measurement system). For example, "basically" may mean within one or more standard deviations, or within, for example, ±30%, ±20%, ±15%, ±10%, ±5% of the stated value.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the invention and will not be interpreted in an idealized or overly formal sense unless expressly so defined herein.

Exemplary embodiments are described herein with reference to schematic cross-sectional views illustrating idealized embodiments. Hence, variations of shapes resulting from manufacturing technologies and/or tolerances, for instance, are to be expected. Hence, the embodiments described herein should not be construed as being limited to the particular shapes of regions as illustrated herein but are to include deviations in shapes that result, for example, from manufacturing. For instance, regions shown or described as being flat may typically have rough and/or non-linear features. Besides, the acute angle as shown may be round. Therefore, the regions shown in the drawings are schematic in nature, and their shapes are not intended to show the exact shape of the regions, and are not intended to limit the scope of the claims.

In the specification, the included angle between two directions (such as vectors) may be deduced by using general mathematics (such as Cosine Rule). Therefore, in the specification, it does not restrict that an included angle formed by two directions must be an included angle having a cross point. For instance, a straight line corresponding to an extending direction and another straight line corresponding to another extending direction are essentially skew lines that do not intersect and are not parallel to each other, but the extending direction and the another extending direction may also have an included angle derived according to a general mathematics. In addition, in space, an included angle between a direction and a plane usually refers to the complementary angle formed by the direction and the normal vector of the plane and may also be deduced by using general mathematics. Moreover, the numerical values recited in the specification may include the numerical values and the deviation values within the deviation range acceptable to a person having ordinary skill in the art. The deviation values may be one or more standard deviations in the manufacturing process or measuring process, or may be the calculation errors caused by some factors, such as the number of digits used in the calculation or conversion process, rounding number up or down, unit conversion, or error propagation, etc.

Figure 1C:
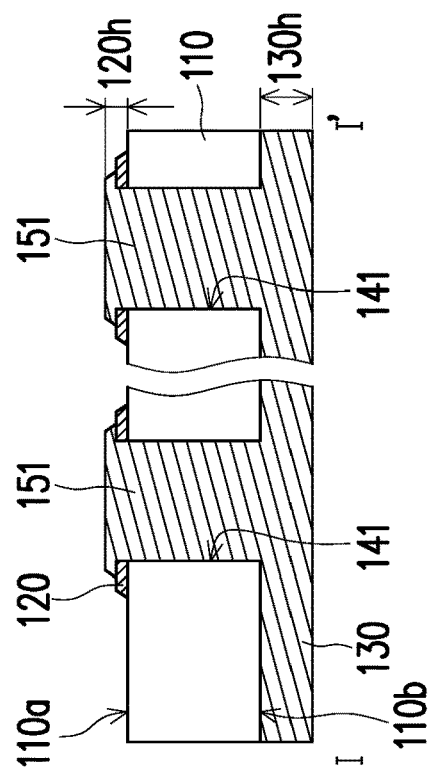
FIG. 1C is a cross-sectional schematic view of the portion of the flexible electronic device according to the first embodiment of the disclosure.
Figure 1B:
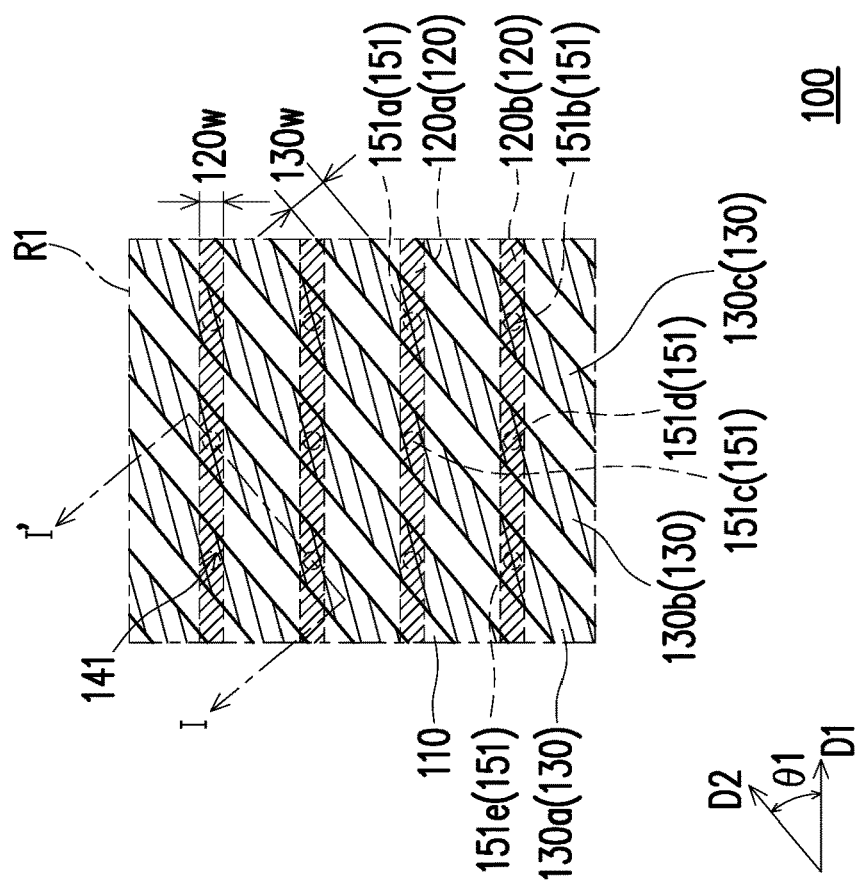
FIG. 1B is a bottom schematic view of a portion of the flexible electronic device according to the first embodiment of the disclosure.

FIG. 1A is a bottom schematic view of a flexible electronic device according to a first embodiment of the disclosure. FIG. 1B is a bottom schematic view of a portion of the flexible electronic device according to the first embodiment of the disclosure. FIG. 1C is a cross-sectional schematic view of the portion of the flexible electronic device according to the first embodiment of the disclosure. For instance, FIG. 1B may be an enlargement view of a region R1 in FIGS. 1A, and 1C may be a cross-sectional schematic view corresponding to a cross-sectional line I-I' in FIG. 1B.

With reference to FIG. 1A to FIG. 1B, a flexible electronic device 100 includes a flexible substrate 110, a plurality of first signal lines 120, a plurality of first transmission lines 130, a plurality of first through holes 141, and a plurality of first conductive structures 151. The flexible substrate 110 has a first surface 110a and a second surface 110b. The second surface 110b is opposite to the first surface 110a. The first signal lines 120 are located on the first surface 110a of the flexible substrate 110. The first signal lines 120 have a first extending direction D1. The first transmission lines 130 are located on the second surface 110b of the flexible substrate 110. The first transmission lines 130 have a second extending direction D2. A first included angle θ1 is provided between the first extending direction D1 and the second extending direction D2, and an angle of the first included angle θ1 is between 10° (degrees) and 80°. The first through holes 141 penetrate through the flexible substrate 110. The first conductive structures 151 are located in the first through holes 141. The first conductive structures 151 are electrically connected to the first signal lines 120 and the first transmission lines 130.

In addition, for the sake of clarity, not all the first signal lines 120, the first transmission lines 130, the first through holes 141, or the first conductive structures 151 are marked one by one in the figures (e.g., FIG. 1A, FIG. 1B, or other following similar figures).

In the present embodiment, through the first through holes 141 penetrating through the flexible substrate 110, a stress or stresses of the flexible substrate 110 or other film layers located thereon may be discontinuous. In this way, the flexible electronic device 100 may not be easily curled and deformed when not being applied by an external force.

In an embodiment, the through holes (such as, but not limited to the first through holes 141) penetrating through the flexible substrate 110 may be formed through laser drilling, which should however not be construed as limitations to the disclosure.

In the present embodiment, through the first transmission lines 130 located on the second surface 110*b* of the flexible substrate 110 and when the first included angle θ1 provided between the second extending direction D2 of the first transmission lines 130 and the first extending direction D1 of the first signal lines 120 is configured to be between 100 and 800, the flexible electronic device 100 may not be easily curled and deformed when not being applied by an external force.

In the present embodiment, the angle of the first included angle θ1 may further be between 40° and 50°. In this way, the flexible electronic device 100 may further not be easily curled and deformed when not being applied by an external force.

In the present embodiment, the first signal lines 120 and the first transmission lines 130 electrically connected to each other through the first conductive structures 151 may facilitate quality improvement of electronic signals or power supply. For instance, a voltage drop (IR drop) may be reduced.

In the present embodiment, one of the first extending direction D1 and the second extending direction D2 may be basically parallel to or basically perpendicular to at least one edge of the flexible substrate 110, which should however not be construed as limitations to the disclosure.

For instance, the flexible substrate 110 may have a first edge E1, a second edge E2, a third edge E3, and a fourth edge E4. The third edge E3 is opposite to the first edge E1. The fourth edge E4 is opposite to the second edge E2. The first extending direction D1 may be basically parallel to the first edge E1, and/or the first extending direction D1 may be basically parallel to the third edge E3. The first extending direction D1 may be basically perpendicular to the second edge E2, and/or the first extending direction D1 may be basically perpendicular to the fourth edge E4.

In the present embodiment, a thickness 130*h* of each of the first transmission lines 130 may be greater than a thickness 120*h* of each of the first signal lines 120, which should however not be construed as limitations to the disclosure.

In an embodiment, the first signal lines 120 may be formed on the first surface 110*a* of the flexible substrate 110 through sputtering.

In an embodiment, a seed layer may be formed on the second surface 110*b* of the flexible substrate 110, and an electroplating layer may then be electroplated on the seed layer through electroplating. Further, after a patterning step is performed on the seed layer and after the patterning step is performed on the electroplating layer, the patterned seed layer and the patterned electroplating layer are configured to form the first transmission lines 130.

In an embodiment, in a fabrication process during which the first transmission lines 130 are formed, a conductive material configured to form the first transmission lines 130 may further fills in the through holes (e.g., the first through holes 141) penetrating through the flexible substrate 110, so that the first conductive structures 151 are formed.

In an embodiment, the conductive material filling the first through holes 141 may further cover the first surface 110*a* of the flexible substrate 110 to form a portion of the first signal lines 120.

In the present embodiment, a line width 130*w* of each of the first transmission lines 130 may be different from a line width 120*w* of each of the first signal lines 120, which should however not be construed as limitations to the disclosure. In an embodiment, the line width may be a corresponding dimension perpendicular to an extending direction of the line. For instance, the line width 120*w* of each of the first signal lines 120 may be the corresponding dimension perpendicular to the first extending direction D1 of the first signal lines 120.

In an embodiment, the first surface 110*a* of the flexible substrate 110 may be provided with the first signal lines 120 and other elements (e.g., an active element, a light-emitting element, etc.), and the first surface 110*a* of the flexible substrate 110 may be provided with the first transmission lines 130. Therefore, the line width 130*w* of each of the first transmission lines 130 may be greater than the line width 120*w* of each of the first signal lines 120, so that stresses applied on two opposite sides (i.e., the first surface 110*a* and the second surface 110*b*) of the flexible substrate 110 may thus be consistent. In this way, the flexible electronic device 100 may not be easily curled and deformed when not being applied by an external force.

Generally, the flexible electronic device 100 may be easily curled or bent along an edge parallel to the flexible substrate 110. As such, the first transmission lines 130 may be configured not to be parallel to any edge of the flexible substrate 110, the line width 130*w* of each of first transmission lines 130 may be configured to be greater than the line width 120*w* of each of the first signal lines 120, and/or the thickness 130*h* of each of the first transmission lines 130 may be configured to be greater than the thickness 120*h* of each of the first signal lines 120. Accordingly, a cross-sectional area of the first transmission lines 130 in a curling or bending direction (basically in a direction parallel to the edge of the flexible substrate 110) may be greater than a cross-sectional area of the first signal lines 120. In this way, when a same force is applied, the stress (i.e., the force that each unit area is subjected to) that the flexible electronic device 100 is subjected to is reduced, so that the flexible electronic device 100 may not be damaged.

In this embodiment, each of the first signal lines 120 is electrically connected to plural first transmission lines 130 through corresponding plural first conductive structures 151, or each of the first transmission lines 130 is electrically connected to the plural first signal lines 120 through the corresponding plural first conductive structures 151.

For instance, the first signal lines 120 may include a first signal line 120a and a first signal line 120b. The first transmission lines 130 may include a first transmission line 130a, a first transmission line 130b, and a first transmission line 130c. The first conductive structures 151 may include a first conductive structure 151a, a first conductive structure 151b, a first conductive structure 151c, a first conductive structure 151d, and a first conductive structure 151e. The first signal line 120a may be electrically connected to the first transmission line 130b and the first transmission line 130a through the first conductive structure 151a and the first conductive structure 151c. The first signal line 120b may be electrically connected to the first transmission lines 130c, the first transmission lines 130b, and the first transmission line 130a through the first conductive structures 151b, the first conductive structure 151d, and the first conductive structure 151e. The first transmission line 130a may be electrically connected to the first signal line 120a and the first signal line 120b through the first conductive structure 151c and the first conductive structure 151e. The first transmission line 130b may be electrically connected to the first signal line 120a and the first signal line 120b through the first conductive structure 151a and the first conductive structure 151d.

In an embodiment, the first signal lines 120 and the first transmission lines 130 may be electrically connected to a common voltage source (e.g., Vdd or Vss), which should however not be construed as limitations to the disclosure.

Figures 2A, 2B:
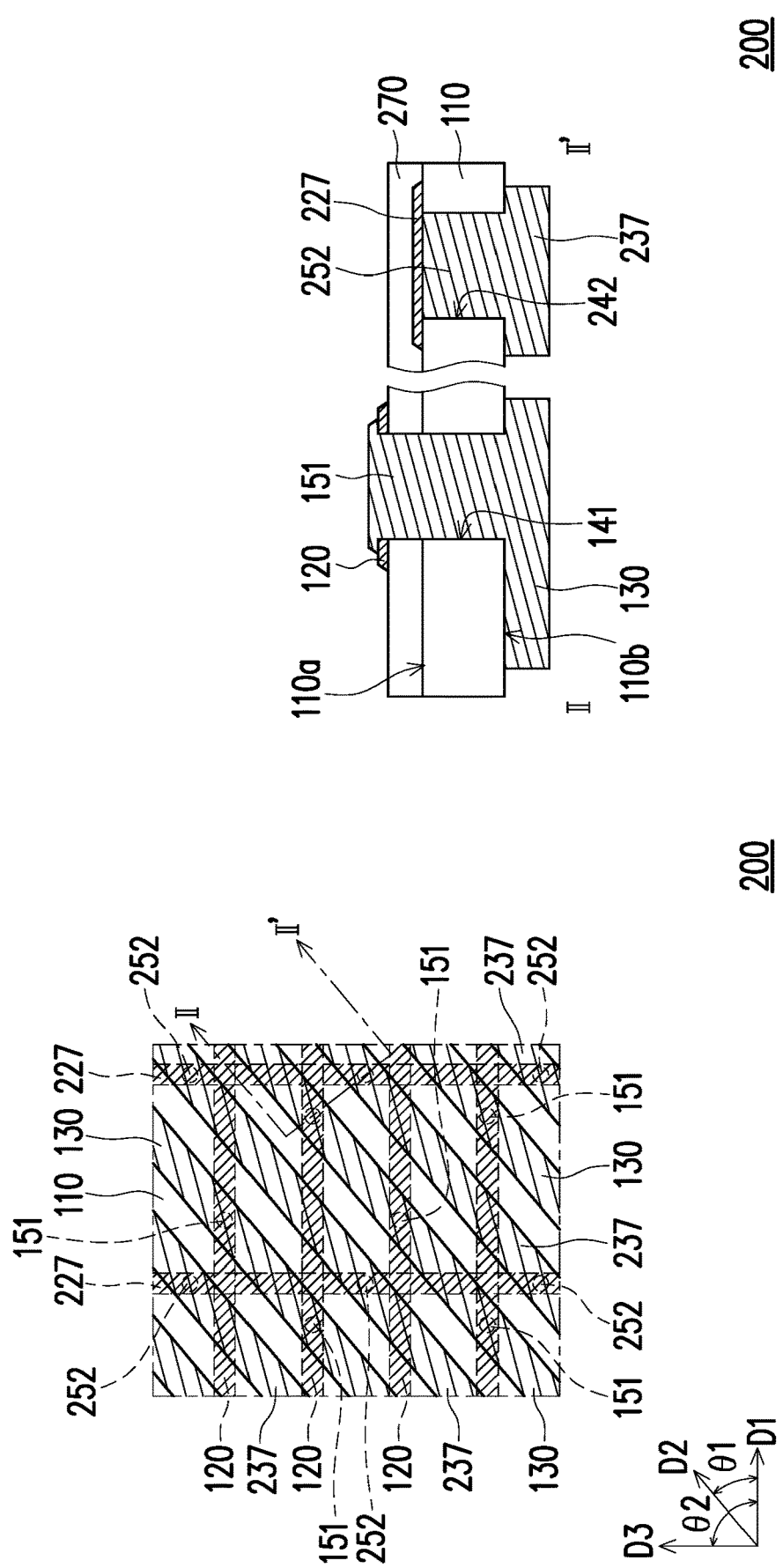
FIG. 2A is a bottom schematic view of a portion of a flexible electronic device according to a second embodiment of the disclosure.
FIG. 2B is a cross-sectional schematic view of the portion of the flexible electronic device according to the second embodiment of the disclosure.

FIG. 2A is a bottom schematic view of a portion of a flexible electronic device according to a second embodiment of the disclosure. FIG. 2B is a cross-sectional schematic view of the portion of the flexible electronic device according to the second embodiment of the disclosure. For instance, FIG. 2A may be a bottom schematic view of a portion similar to the region R1 in FIG. 1A. For instance, FIG. 2B may be a cross-sectional schematic view corresponding to a cross-sectional line II-II' in FIG. 2A. A flexible electronic device 200 provided by this embodiment is similar to the flexible electronic device 100 provided by the first embodiment, so similar members are referred to by the same reference numbers and exhibit similar functions, materials, or formation methods, and description thereof is omitted.

With reference to FIG. 2B to FIG. 2C, the flexible electronic device 200 may include the flexible substrate 110, the first signal lines 120, the first transmission lines 130, the first through holes 141, the first conductive structures 151, a plurality of second signal lines 227, a plurality of second transmission lines 237, a plurality of second through hole 242, and a plurality of second conductive structures 252. The second signal lines 227 are located on the first surface 110a of the flexible substrate 110. The second signal lines 227 have a third extending direction D3. The second transmission lines 237 are located on the second surface 110b of the flexible substrate 110. The second transmission lines 237 have the second extending direction D2. The first signal lines 120 and the first transmission lines 130 are electrically separated from the second signal lines 227, and the first signal lines 120 and the first transmission lines 130 are electrically separated from the second transmission lines 237. The second through holes 242 penetrate through the flexible substrate 110. The second conductive structures 252 are located in the second through holes 242. The second conductive structures 252 are electrically connected to the second signal lines 227 and the second transmission lines 237.

In the present embodiment, a second included angle θ2 may be provided between the third extending direction D3 and the first extending direction D1. That is, the third extending direction D3 is basically not parallel to the first extending direction D1.

In the present embodiment, an angle of the second included angle θ2 may not be identical to the angle of the first included angle θ1, which should however not be construed as limitations to the disclosure.

In the present embodiment, the third extending direction D3 may basically be perpendicular to the first extending direction D1, which should however not be construed as limitations to the disclosure.

In the present embodiment, the flexible electronic device 200 may further includes an insulator layer 270. The insulator layer 270 is located between the first signal lines 120 and the second signal lines 227. In an embodiment, the insulator layer 270 may be called as a buffer layer, a gate insulator layer, or a plane layer, which should however not be construed as limitations to the disclosure.

In the present embodiment, the first through holes 141 may further penetrate through a film layer located on a surface of the flexible substrate 110. For instance, the first through holes 141 may further penetrate through the insulator layer 270 located on the first surface 110a of the flexible substrate 110.

In an embodiment, the first signal lines 120 and the first transmission lines 130 may be electrically connected to a type of common voltage source (e.g., one of Vdd and Vss), and the second signal lines 227 and the second transmission lines 237 may be electrically connected to another type of common voltage source (e.g., the other one of Vdd and Vss), which should however not be construed as limitations to the disclosure.

Figures 3A, 3B:
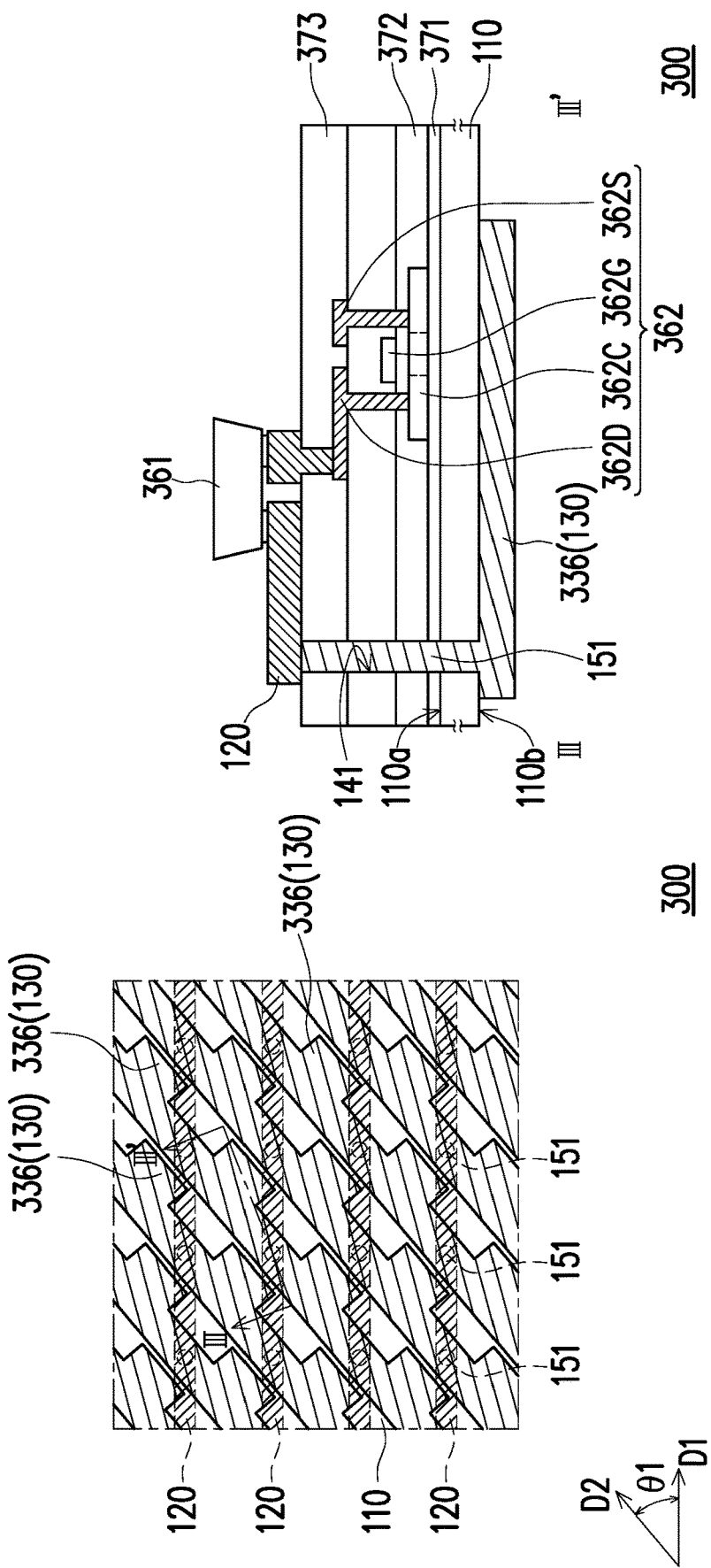
FIG. 3A is a bottom schematic view of a portion of a flexible electronic device according to a third embodiment of the disclosure.
FIG. 3B is a cross-sectional schematic view of the portion of the flexible electronic device according to the third embodiment of the disclosure.

FIG. 3A is a bottom schematic view of a portion of a flexible electronic device according to a third embodiment of the disclosure. FIG. 3B is a cross-sectional schematic view of the portion of the flexible electronic device according to the third embodiment of the disclosure. For instance, FIG. 3A may be a bottom schematic view of a portion similar to the region R1 in FIG. 1A. For instance, FIG. 3B may be a cross-sectional schematic view corresponding to a cross-sectional line III-III' in FIG. 3A. A flexible electronic device 300 provided by this embodiment is similar to the flexible electronic device 100 provided by the first embodiment, so similar members are referred to by the same reference numbers and exhibit similar functions, materials, or formation methods, and description thereof is omitted.

With reference to FIG. 3A to FIG. 3B, the flexible electronic device 300 includes the flexible substrate 110, the first signal lines 120, the first transmission lines 130, the first through holes 141, the first conductive structures 151, a light-emitting element 361, and a driving element 362. The light-emitting element 361 may be located on the first surface 110a of the flexible substrate 110. The driving element 362 may be located on the first surface 110a of the flexible substrate 110. The light-emitting element 361 is electrically connected to the driving element 362. One of the light-emitting element 361 and the driving element 362 is electrically connected to the first signal lines 120.

In the present embodiment, one end (e.g., one of a cathode and an anode) of the light-emitting element 361 is electrically connected to the driving element 362, and the other end (e.g., the other one of the cathode and the anode) of the light-emitting element 361 is electrically connected to the first signal lines 120.

In the present embodiment, the driving element 362 may be a thin film transistor (TFT). For instance, the driving element 362 may include a source 362S, a drain 362D, a gate 362G, and a channel 362C. The light-emitting element 361 is electrically connected to the drain 362D of the driving element 362. In the embodiment depicted in FIG. 3B, the driving element 362 may be a top gate TFT, which should however not be construed as limitations to the disclosure. In other embodiments, a driving element (may still be called as a driving device) similar to the driving device 362 may be a bottom gate TFT or a dual gate TFT.

In an embodiment that is not shown, a driving element (may still be called as a driving element) similar to the driving element 362 may be a driving chiplet, which should however not be construed as limitations to the disclosure.

In the present embodiment, the first through holes 141 may further penetrate through an insulator layer located on the first surface 110a of the flexible substrate 110. For instance, the first through holes 141 may further penetrate through an insulator layer 371 (e.g., similar, but not limited to, the insulator layer called as the buffer layer) located between the flexible substrate 110 and the driving element 362, an insulator layer 372 (e.g., similar, but not limited to, the insulator layer called as the gate insulator layer) located between the channel 362C and the gate 362G, and/or an insulator layer 373 (e.g., similar, but not limited to, the insulator layer called as a planarization layer) covering the driving element 362.

In this embodiment, the first transmission lines may have a protection region 336, and the protection region 336 overlaps with the light-emitting element 361 or the driving element 362.

In the present embodiment, a projection area of a vertical projection of the protection region 336 on the first surface 110a/second surface 110b (or a dummy surface parallel thereto) is greater than a projection area of a vertical projection of the light-emitting element 361 on the first surface 110a/second surface (or a dummy surface parallel thereto), and/or the projection area of the vertical projection of the protection region 336 on the first surface 110a/second surface 110b (or a dummy surface parallel thereto) is greater than a projection area of a vertical projection of the driving element 362 on the first surface 110a/second surface (or a dummy surface parallel thereto). In this way, when the flexible electronic device 300 is curled or bent when being applied by a force, the light-emitting element 361 or the driving element 362 may not be damaged.

In the present embodiment, the protection region 336 may not overlap with the first conductive structures 151, which should however not be construed as limitations to the disclosure.

Figure 4:
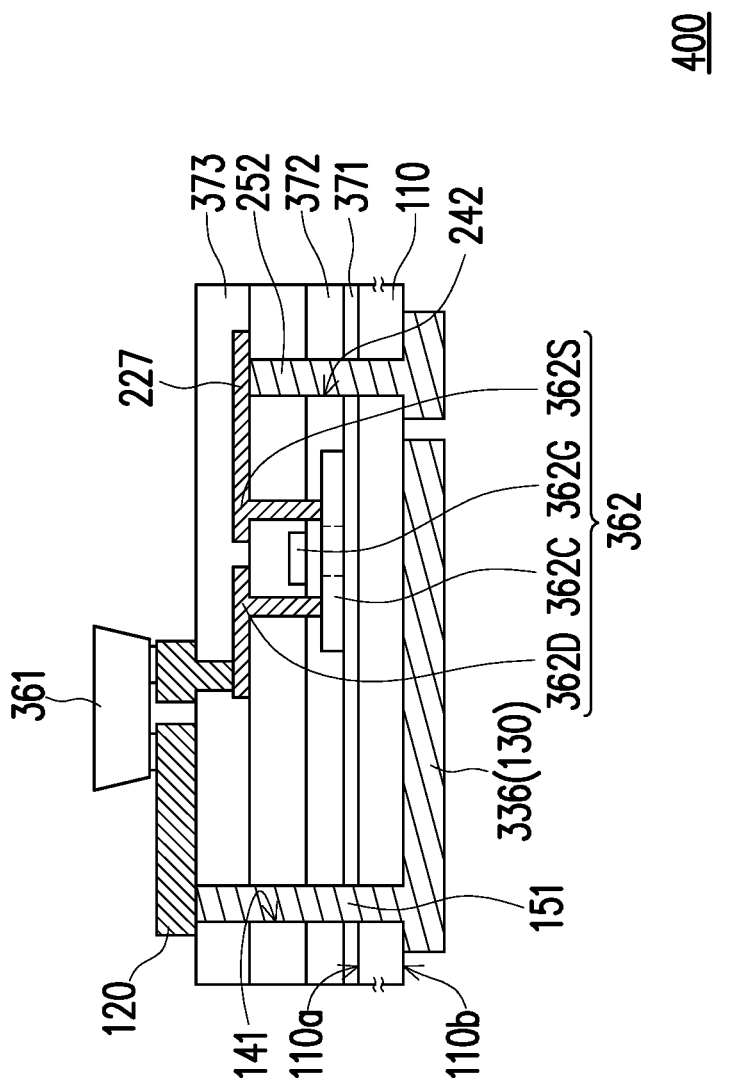
FIG. 4 is a cross-sectional schematic view of a portion of a flexible electronic device according to a fourth embodiment of the disclosure.

FIG. 4 is a cross-sectional schematic view of a portion of a flexible electronic device according to a fourth embodiment of the disclosure. For instance, FIG. 4 may be a cross-sectional schematic view taken along a cross-sectional line similar to III-III' in FIG. 3A. A flexible electronic device 400 provided by this embodiment is similar to the flexible electronic device 200 provided by the second embodiment or the flexible electronic device 300 provided by the third embodiment, so similar members are referred to by the same reference numbers and exhibit similar functions, materials, or formation methods, and description thereof is omitted.

With reference to FIG. 4, the flexible electronic device 400 may include the flexible substrate 110, the first signal lines 120, the first transmission lines 130, the first through holes 141, the first conductive structures 151, the second signal lines 227, the second transmission lines 237, the second through hole 242, the second conductive structures 252, the light-emitting element 361, and the driving element 362.

In the present embodiment, one end (e.g., one of the cathode and the anode) of the light-emitting element 361 may be electrically connected to the drain 362D of the driving element 362, the other end (e.g., the other one of the cathode and the anode) of the light-emitting element 361 is electrically connected to the first signal lines 120, and the source 362S of the driving element 362 may be electrically connected to the second signal lines 227.

In the present embodiment, the first signal lines 120 may be electrically connected to a common voltage source (e.g., Vdd), which should however not be construed as limitations to the disclosure.

In the present embodiment, the second signal lines 227 may be electrically connected to a working voltage source (e.g., Vss), which should however not be construed as limitations to the disclosure.

Figures 5A, 5B:
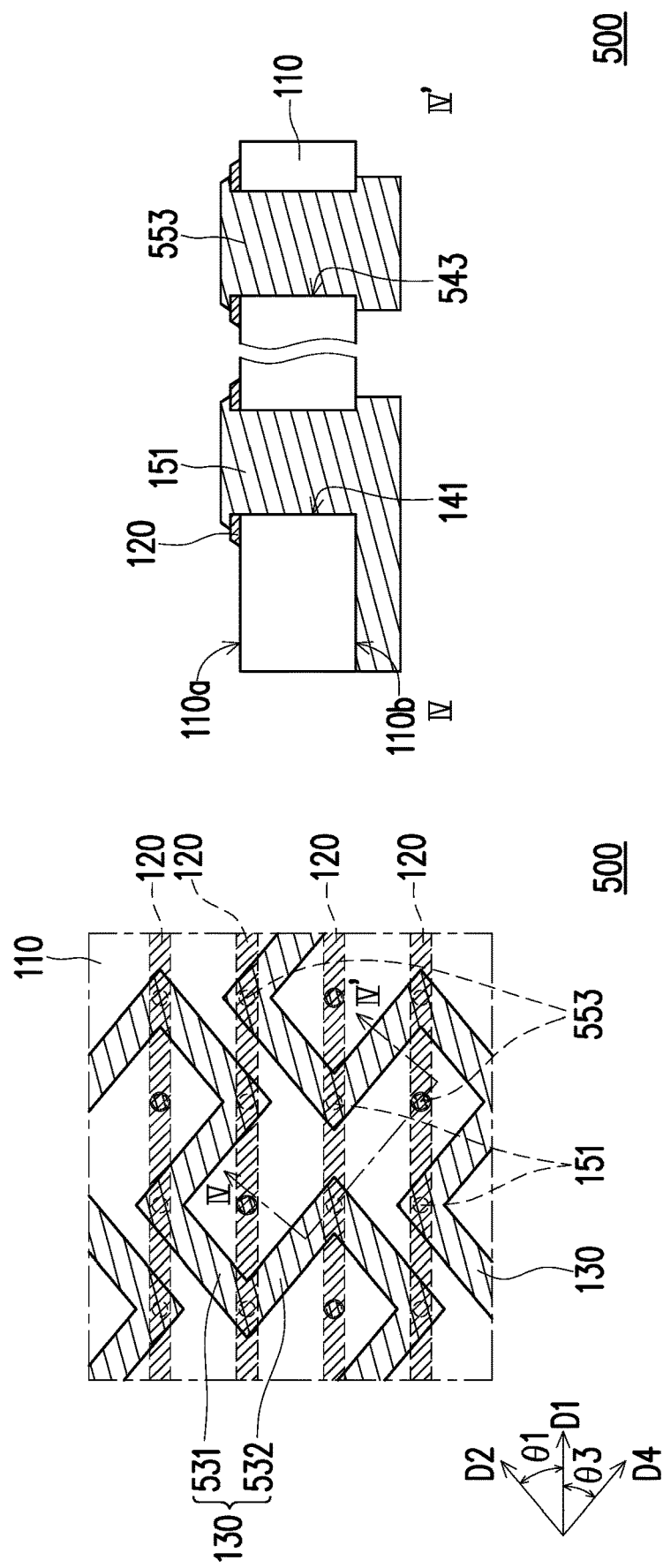
FIG. 5A is a bottom schematic view of a portion of a flexible electronic device according to a fifth embodiment of the disclosure.
FIG. 5B is a cross-sectional schematic view of the portion of the flexible electronic device according to the fifth embodiment of the disclosure.

FIG. 5A is a bottom schematic view of a portion of a flexible electronic device according to a fifth embodiment of the disclosure. FIG. 5B is a cross-sectional schematic view of the portion of the flexible electronic device according to the fifth embodiment of the disclosure. For instance, FIG. 5A may be a bottom schematic view of a portion similar to the region R1 in FIG. 1A. For instance, FIG. 5B may be a cross-sectional schematic view corresponding to a cross-sectional line IV-IV' in FIG. 5A. A flexible electronic device 500 provided by this embodiment is similar to the flexible electronic device 100 provided by the first embodiment, so similar members are referred to by the same reference numbers and exhibit similar functions, materials, or formation methods, and description thereof is omitted.

With reference to FIG. 5, the flexible electronic device 500 includes the flexible substrate 110, the first signal lines 120, the first transmission lines 130, the first through holes 141, the first conductive structures 151, a plurality of third through holes 543, and a plurality of third conductive structures 553. The third through holes 543 penetrate through the flexible substrate 110. The third conductive structures 553 are located in the third through holes 543. The third conductive structures 553 are electrically connected to the first signal lines 120 and do not overlap with the first transmission lines 130. For instance, the third conductive structures 553 may be electrically connected to the corresponding first signal lines 120 through the corresponding first signal lines 120. Moreover, a vertical projection of the third conductive structures 553 on the first surface 110a/second surface 110b does not overlap with a vertical projection of the first transmission lines 130 on the first surface 110a/second surface 110b.

In the present embodiment, a method for routing the first transmission lines 130 may be adjusted according to design needs. For instance, part of the first transmission lines 130 may include first transmission sections 531 and second transmission sections 532. The first transmission sections 531 may have the second extending direction D2, the second transmission sections 532 may have a fourth extending direction D4, and the second extending direction D2 may be different from the fourth extending direction D4.

In the present embodiment, the first included angle θ1 may be provided between the second extending direction D2 and the first extending direction D1, and the angle of the first included angle θ1 is between 10° and 80°. In an embodiment, the angle of the first included angle θ1 may further be between 40° and 50°.

In the present embodiment, a third included angle θ3 may be provided between the fourth extending direction D4 and the first extending direction D1, and an angle of the third included angle θ3 is between 10° and 80°. In an embodiment, the angle of the third included angle θ3 may further be between 40° and 50°.

In the present embodiment, the first conductive structures 151 may be located on junctions of the first transmission sections 531 and the second transmission sections 532, which should however not be construed as limitations to the disclosure.

In the present embodiment, viewing from a direction (e.g., the direction shown in FIG. 5A) perpendicular to the first surface 110a or the second surface 110b, the first conductive structures 151 and the third conductive structures 553 may be arranged into an array, which should however not be construed as limitations to the disclosure.

Figure 6:
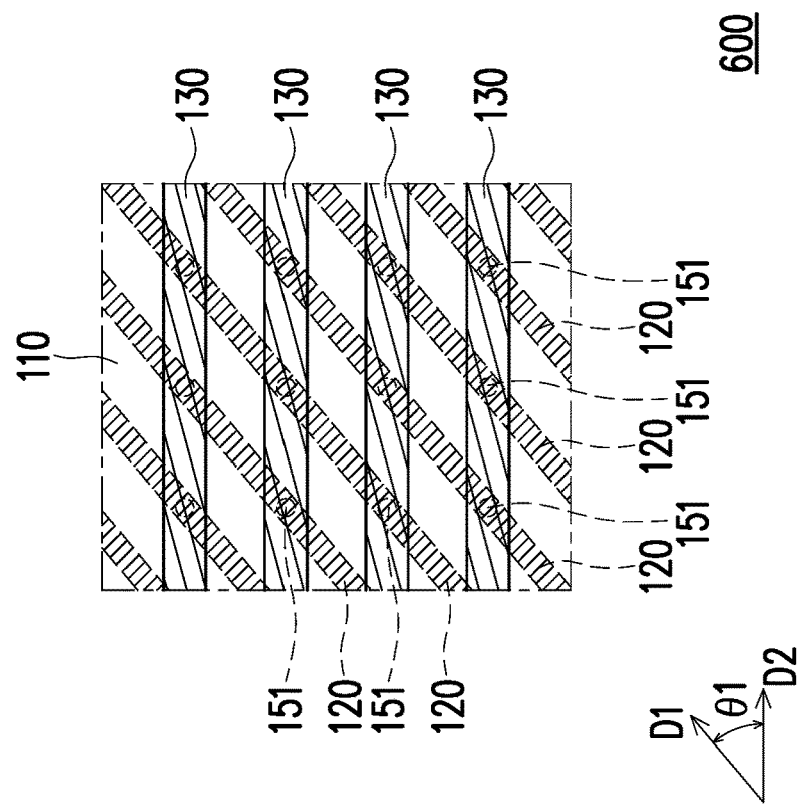
FIG. 6 is a bottom schematic view of a portion of a flexible electronic device according to a sixth embodiment of the disclosure.

FIG. 6 is a bottom schematic view of a portion of a flexible electronic device according to a sixth embodiment of the disclosure. For instance, FIG. 6 may be a bottom schematic view of a portion similar to the region R1 in FIG. 1A. A flexible electronic device 600 provided by this embodiment is similar to the flexible electronic device 100 provided by the first embodiment, so similar members are referred to by the same reference numbers and exhibit similar functions, materials, or formation methods, and description thereof is omitted.

In the present embodiment, the second extending direction D2 may be basically parallel to the first edge E1 (shown in FIG. 1A), and/or the second extending direction D2 may be basically parallel to the third edge E3 (shown in FIG. 1A). The second extending direction D2 may be basically perpendicular to the second edge E2 (shown in FIG. 1A), and/or the second extending direction D2 may be basically perpendicular to the fourth edge E4 (shown in FIG. 1A).

Figure 7:
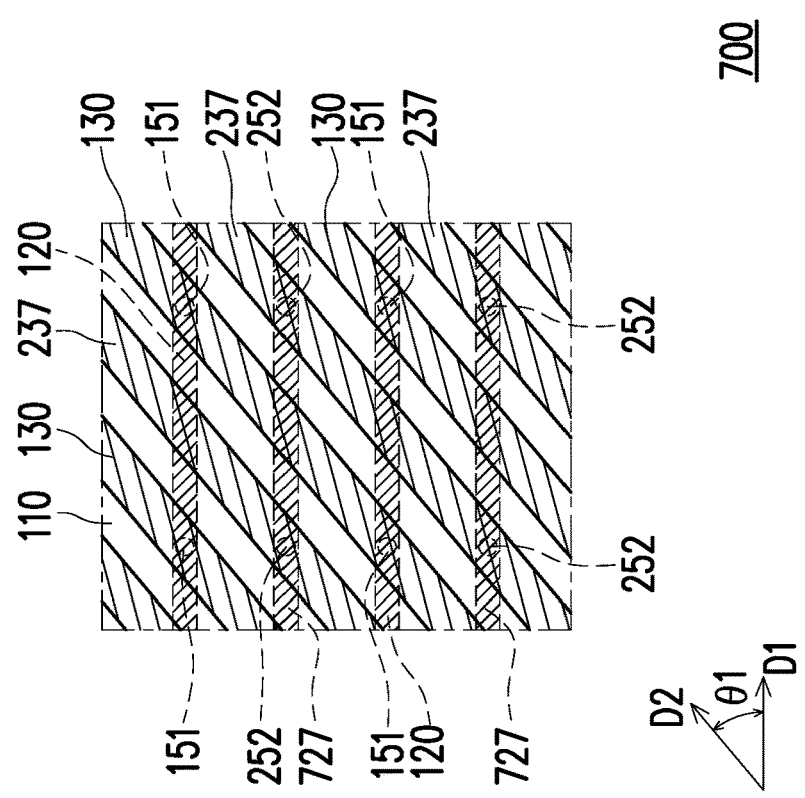
FIG. 7 is a bottom schematic view of a portion of a flexible electronic device according to a seventh embodiment of the disclosure.

FIG. 7 is a bottom schematic view of a portion of a flexible electronic device according to a seventh embodiment of the disclosure. For instance, FIG. 7 may be a bottom schematic view of a portion similar to the region R1 in FIG. 1A. A flexible electronic device 700 provided by this embodiment is similar to the flexible electronic device 200 provided by the second embodiment, so similar members are referred to by the same reference numbers and exhibit similar functions, materials, or formation methods, and description thereof is omitted.

With reference to FIG. 7, the flexible electronic device 700 may include the flexible substrate 110, the first signal lines 120, the first transmission lines 130, the first through holes 141, the first conductive structures 151, the second signal lines 727, the second transmission lines 237, the second through hole 242, and the second conductive structures 252. The first signal lines 120 and the first transmission lines 130 are electrically separated from the second signal lines 727, and the first signal lines 120 and the first transmission lines 130 are electrically separated from the second transmission lines 237. The second conductive structures 252 are electrically connected to the second signal lines 727 and the second transmission lines 237.

In the present embodiment, the extending direction of the second signal lines 727 may be basically parallel to the first extending direction D1.

In the present embodiment, the second signal lines 727 and the first signal lines 120 may be the same patterned conductive layer, which should however not be construed as limitations to the disclosure. In an embodiment, the second signal lines 727 and the first signal lines 120 may be different patterned conductive layers.

Figure 8:
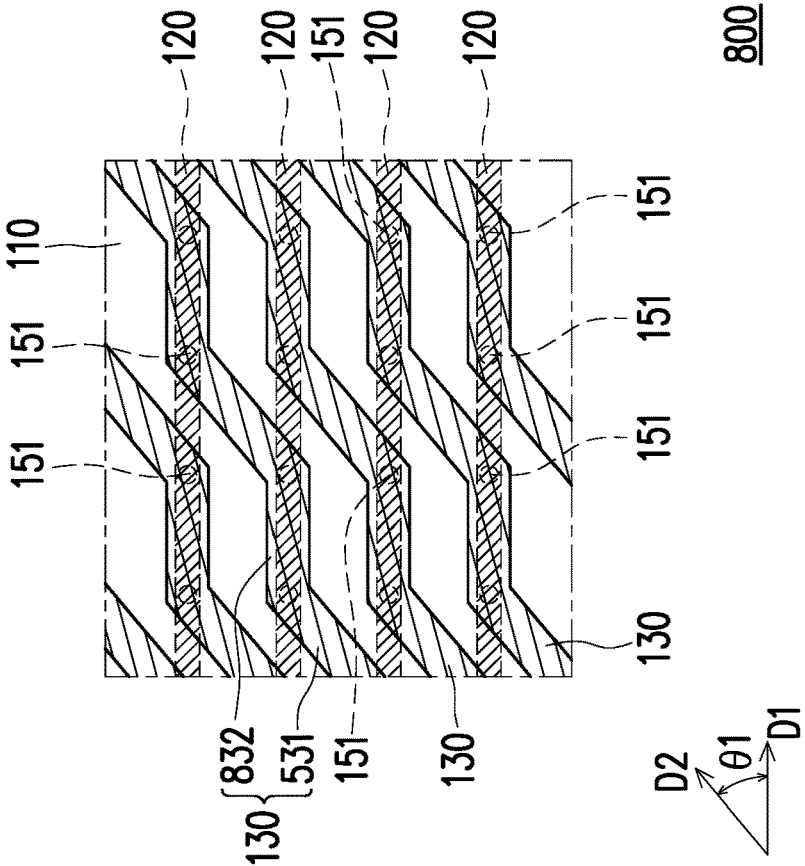
FIG. 8 is a bottom schematic view of a portion of a flexible electronic device according to an eighth embodiment of the disclosure.

FIG. 8 is a bottom schematic view of a portion of a flexible electronic device according to an eighth embodiment of the disclosure. For instance, FIG. 8 may be a bottom schematic view of a portion similar to the region R1 in FIG. 1A. A flexible electronic device 800 provided by this embodiment is similar to the flexible electronic device 100 provided by the first embodiment, so similar members are referred to by the same reference numbers and exhibit similar functions, materials, or formation methods, and description thereof is omitted.

In the present embodiment, the method for routing the first transmission lines 130 may be adjusted according to design needs. For instance, part of the first transmission lines 130 may include the first transmission sections 531 and second transmission sections 832. The first transmission sections 531 may have the second extending direction D2, the first included angle θ1 may be provided between the second extending direction D2 and the first extending direction D1, and the angle of the first included angle is between 10° and 80°.

In the present embodiment, the first conductive structures 151 may be located on junctions of the first transmission sections 531 and the second transmission sections 832, which should however not be construed as limitations to the disclosure.

In the present embodiment, the second transmission sections 832 may have the first extending direction D1, which should however not be construed as limitations to the disclosure.

Figure 9:
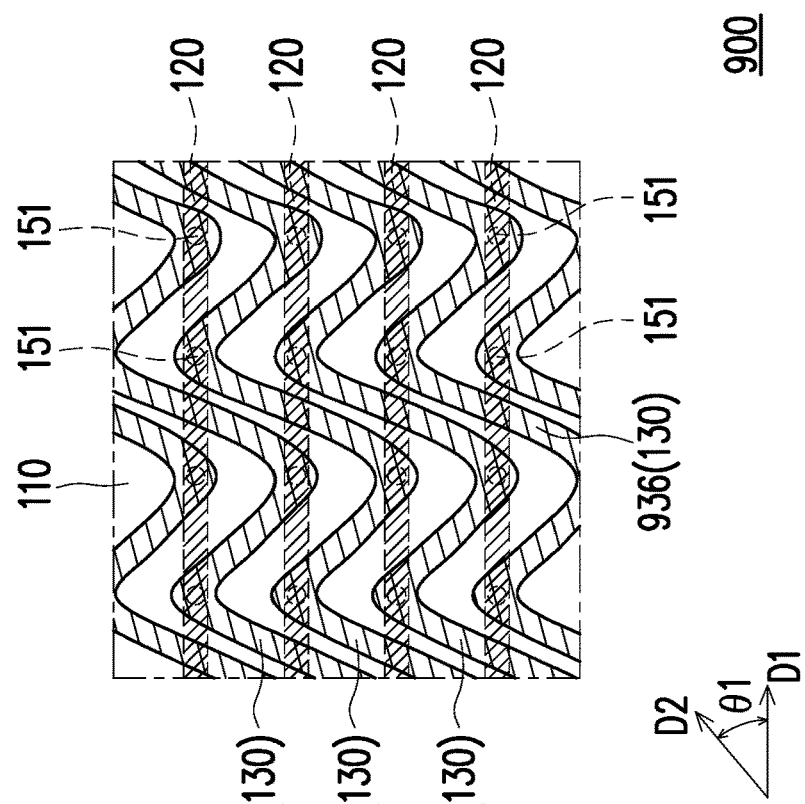
FIG. 9 is a bottom schematic view of a portion of a flexible electronic device according to a ninth embodiment of the disclosure.

FIG. 9 is a bottom schematic view of a portion of a flexible electronic device according to a ninth embodiment of the disclosure. For instance, FIG. 9 may be a bottom schematic view of a portion similar to the region R1 in FIG. 1A. A flexible electronic device 900 provided by this embodiment is similar to the flexible electronic device 100 provided by the first embodiment, so similar members are referred to by the same reference numbers and exhibit similar functions, materials, or formation methods, and description thereof is omitted.

In the present embodiment, the method for routing the first transmission lines 130 may be adjusted according to design needs. For instance, part of the first transmission lines 130 may be curved, and tangent lines of a point of each of the curved first transmission lines 130 has the second extending direction D2. The first included angle θ1 may be provided between the second extending direction D2 and the first extending direction D1, and the angle of the first included angle θ1 is between 10° and 80°.

A size of the light-emitting element 361 provided in the foregoing embodiments is, for example less than 100 microns and is preferably be less than 50 microns but greater than 0 microns. The light-emitting element 361 may be, for example, an inorganic light-emitting element, which should however not be construed as limitations to the disclosure. A structure of the inorganic light-emitting element 361 may be a P-N diode, a P-I-N diode, or other suitable structures. A type of the light-emitting element 361 may be a vertical light-emitting element, a horizontal light-emitting element, or flip chip light-emitting element. The light-emitting element 361 may be made of an organic material (e.g., an organic polymer light-emitting material, an organic small molecule light-emitting material, an organic complex light-emitting material, other suitable materials, or a combination of the foregoing materials), an inorganic (e.g., a perovskite material, a rare earth ion light-emitting material, a rare earth fluorescent material, a semiconductor light-emitting material, other suitable materials, or a combination of the foregoing materials), other suitable materials, or a combination of the foregoing materials.

In addition, the driving element 362 provided in the foregoing embodiments, other active elements (not shown), and a capacitor (not shown) may be called as two active elements and one capacitor (may be presented as 2T1C) for short. In other embodiments, numbers of the driving element 362, other active elements (not shown), and the capacitor corresponding to each light-emitting element 361 may be changed according to design. Three active elements and one or two capacitors may be called for short (may be presented as 3T1C/2C), four active elements and one or two capacitors may be called for short (may be presented as 4T1C/2C), five active elements and one or two capacitors may be called for short (may be presented as 5T1C/2C), six active elements and one or two capacitors may be called for short (may be presented as 6T1C/2C), or other suitable circuit configurations.

In the foregoing embodiments, the conductive layer may be a single-layered structure or a multiple-layered structure. If the conductive layer has a multiple-layered structure, an insulator material may not be provided between the multiple-layered structure.

In the foregoing embodiments, the insulator layer may be a single-layered structure or a multiple-layered structure. If the insulator layer has a multiple-layered structure, an insulator material may not be provided between layers in the multiple-layered structure.

In view of the foregoing, in the flexible electronic device provided by the disclosure, the first transmission lines are located on the second surface, and the first included angle of 10° to 80° is provided between the first extending direction of the first signal lines and the second extending direction of the first transmission lines. In this way, the flexible electronic device may not be easily curled and deformed when not being applied by an external force.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A flexible electronic device, comprising:
   a flexible substrate, having a first surface and a second surface opposite to the first surface;
   a plurality of first signal lines, located on the first surface of the flexible substrate, the first signal lines having a first extending direction;
   a plurality of first transmission lines, located on the second surface of the flexible substrate, the first transmission lines having a second extending direction, wherein a first included angle is provided between the first extending direction and the second extending direction, and an angle of the first included angle is between 10° and 80°;
   a plurality of first through holes, penetrating through the flexible substrate; and
   a plurality of first conductive structures, located in the first through holes, wherein the first conductive structures are electrically connected to the first signal lines and the first transmission lines.

2. The flexible electronic device according to claim 1, wherein each of the first signal lines is electrically connected to the first transmission lines through the corresponding first conductive structures, and/or each of the first transmission lines is electrically connected to the first signal lines through the corresponding first conductive structures.

3. The flexible electronic device according to claim 1, wherein the angle of the first included angle is between 40° and 50°.

4. The flexible electronic device according to claim 1, wherein a thickness of each of the first transmission lines is greater than a thickness of each of the first signal lines.

5. The flexible electronic device according to claim 1, wherein a line width of each of the first transmission lines is greater than a line thickness of each of the first signal lines.

6. The flexible electronic device according to claim 1, wherein one of the first extending direction and the second extending direction is parallel to or is perpendicular to an edge of the flexible substrate.

7. The flexible electronic device according to claim 1, further comprising:
   a plurality of second signal lines, located on the first surface of the flexible substrate, the second signal lines having a third extending direction;
   a plurality of second transmission lines, located on the second surface of the flexible substrate, the second transmission lines having the second extending direction, wherein the first signal lines and the first transmission lines are electrically separated from the second signal lines and the second transmission lines;
   a plurality of second through holes, penetrating through the flexible substrate; and
   a plurality of second conductive structures, located in the second through holes, wherein the second conductive structures are electrically connected to the second signal lines and the second transmission lines.

8. The flexible electronic device according to claim 7, further comprising:
   an insulator layer, located between the first signal lines and the second signal lines.

9. The flexible electronic device according to claim 7, wherein the third extending direction is basically parallel to the first extending direction.

10. The flexible electronic device according to claim 7, wherein a second included angle is provided between the third extending direction and the first extending direction.

11. The flexible electronic device according to claim 10, wherein the second included angle is different from the first included angle.

12. The flexible electronic device according to claim 7, further comprising:
    a light-emitting element, located on the first surface of the flexible substrate, electrically connected to the first signal lines; and
    a driving element, located on the first surface of the flexible substrate, electrically connected to the second signal lines.

13. The flexible electronic device according to claim 1, further comprising:
    a light-emitting element, located on the first surface of the flexible substrate;
    a driving element, located on the first surface of the flexible substrate, wherein the light-emitting element is electrically connected to the driving element, and one of the light-emitting element and the driving element is electrically connected to the first signal lines,
    wherein the first transmission lines have a protection region, and the protection region overlaps with the light-emitting element or the driving element.

14. The flexible electronic device according to claim 13, wherein the protection region does not overlap with the first conductive structures.

15. The flexible electronic device according to claim 13, wherein a projection area of a vertical projection of the protection region on the first surface is greater than a projection area of a vertical projection of the light-emitting element on the first surface or a projection area of a vertical projection of the driving element on the first surface.

16. The flexible electronic device according to claim 1, further comprising:
   a plurality of third through holes, penetrating through the flexible substrate; and
   a plurality of third conductive structures, located in the third through holes, wherein the third conductive structures are electrically connected to the first signal lines and do not overlap with the first transmission lines.

* * * * *